United States Patent
Taniguchi et al.

[11] Patent Number: 5,940,109
[45] Date of Patent: Aug. 17, 1999

[54] THERMAL PRINTHEAD, SUBSTRATE FOR THE SAME AND METHOD FOR MAKING THE SUBSTRATE

[75] Inventors: Hideo Taniguchi; Shinobu Obata; Hiroshi Kinoshita, all of Kyoto, Japan

[73] Assignee: Rohm Co. Ltd., Kyoto, Japan

[21] Appl. No.: 08/961,247

[22] Filed: Oct. 30, 1997

Related U.S. Application Data

[63] Continuation of application No. 08/750,113, filed as application No. PCT/JP95/00999, May 24, 1995, abandoned.

[30] Foreign Application Priority Data

| May 31, 1994 | [JP] | Japan | 6-119003 |
| Jul. 29, 1994 | [JP] | Japan | 6-179237 |
| Aug. 26, 1994 | [JP] | Japan | 6-201845 |
| Mar. 28, 1995 | [JP] | Japan | 7-70162 |
| Mar. 28, 1995 | [JP] | Japan | 7-70163 |

[51] Int. Cl.[6] .................................................. B41J 2/335
[52] U.S. Cl. ........................................ 347/205; 347/202
[58] Field of Search .................................... 347/202, 203, 347/205

[56] References Cited

U.S. PATENT DOCUMENTS

| 4,742,362 | 5/1988 | Takoshima et al. | 346/76 |
| 5,285,216 | 2/1994 | Ota et al. | 346/76 |
| 5,357,271 | 10/1994 | Wiklof et al. | 347/207 |

FOREIGN PATENT DOCUMENTS

| 3906484 | 9/1990 | Germany | 347/205 |
| 57-64576 | 4/1982 | Japan | B41J 3/20 |
| 59-73973 | 4/1984 | Japan | B41J 3/20 |
| 59-83682 | 5/1984 | Japan | 347/205 |
| 60-13565 | 1/1985 | Japan | B41J 3/20 |
| 60-6478 | 1/1985 | Japan | B41J 3/20 |
| 61-227068 | 10/1986 | Japan | 347/200 |
| 61-261068 | 11/1986 | Japan | B41J 3/20 |
| 61-283572 | 12/1986 | Japan | 347/200 |
| 61-283573 | 12/1986 | Japan | 347/200 |
| 62-95240 | 5/1987 | Japan | B41J 3/20 |
| 3-261565 | 11/1991 | Japan | 347/205 |
| 3-290268 | 12/1991 | Japan | B41J 2/335 |
| 6-166197 | 6/1994 | Japan | 347/200 |

*Primary Examiner*—Huan Tran
*Attorney, Agent, or Firm*—Michael D. Bednarek; Crowell & Moring

[57] ABSTRACT

A thermal printhead according to the present invention includes a substrate (2) of an insulating material having a substantially flat surface, a heating resistor (3) formed on the substrate (2) to form a plurality of heating dots, a conductor pattern (5, 6) formed on the substrate for electrical connection to the heating resistor (3), and driving elements mounted on the substrate (2) for selectively heating the heating dots via the conductor pattern (5, 6). The substrate (2) has, in its wall thickness, a hollow portion (10) extending along the heating resistor (3). The present invention also provides a method for making the substrate (2).

11 Claims, 6 Drawing Sheets

THERMAL PRINTHEAD, SUBSTRATE FOR THE SAME AND METHOD FOR MAKING THE SUBSTRATE

SPECIFICATION

This application is a continuation of application Ser. No. 08/750,113 filed Nov. 26, 1996, which is a 371 of PCT/JP95/00999 filed May 24, 1995, now abandoned.

TECHNICAL FIELD

The present invention relates to a thermal printhead, especially to a thermal printhead with a needed power performance improved. Further, the present invention also relates to a substrate for such a thermal printhead and a method for making the substrate.

BACKGROUND ART

Thermal printheads have been widely used for printers of office automation machines such as facsimile machines, for printers of ticket vending machines and for label printers. As is commonly known, the thermal printhead selectively provides heat to a printing medium such as thermosensitive paper or thermal-transfer ink ribbon to form needed image information.

Figure 9:
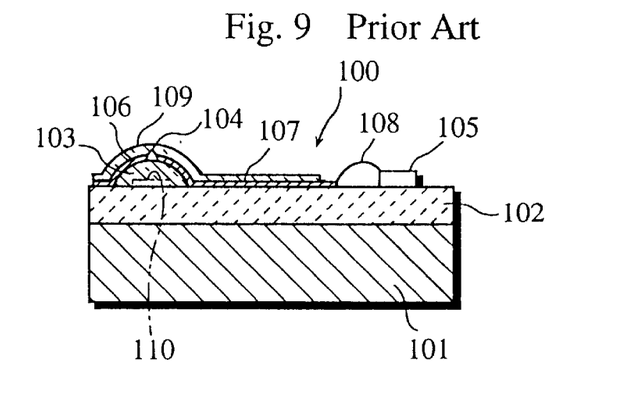
FIG. 9 is a transverse sectional view in the widthwise direction showing a conventional thermal printhead.

For the convenience of explanation, the structure of a typical prior art thick film-type thermal printhead is shown in FIG. 9 of the accompanying drawings. The thermal printhead 100 shown in that figure comprises a solid insulating substrate 102 made of e.g. a ceramic material and fixed on a heat sink plate 101 which is made of a metal such as aluminum having a high thermal conductivity. The upper surface of the substrate 102 is formed with a glass glaze layer 103 as a heat retention member, and a heating resistor 104 is formed linearly on top of the glaze layer 103 to provide an array of heating dots. Further, the upper surface of the substrate 102 is provided with a plurality of drive ICs 105 for supplying electric power to the heating resistor 104.

Further, the substrate 102 carries a common electrode 106 extending on the glaze layer 103 and having comb-like teeth in conduction with the heating resistor 104, and a plurality of individual electrodes 107 similarly extending on the glaze layer 103 and electrically connected to the heating resistor 104. The individual electrodes 107 are connected to the drive ICs 105 via bonding wires 108. The heating resistor 104, the common electrode 106 and the individual electrodes 107 are covered with a protective layer 109 made of a glass material for example.

In the thermal printhead having the above-described arrangement, a predetermined voltage is selectively supplied from the drive ICs via the individual electrodes 107 while the voltage of the common electrode 106 is kept at a constant value, thereby selectively actuating the heating dots of the heating resistor 104 to thermally form images on thermosensitive paper for example.

Generally, it is necessary to enhance the heat retaining ability near the heating resistor 104 in order to improve the printing performance with a small electrical power. For this purpose, in the prior art thermal printhead described above, the glaze layer 103 formed below the heating resistor 104 provides a heat retaining function. On the other hand, a portion of the heat from the heating resistor 104 which has already escaped to the substrate 102 is no longer utilizable for printing. Thus, the heat sink plate 101 serves to quickly dissipate the escaped heat into the atmosphere for preventing a temperature rise of the substrate 102 as a whole.

However, in the prior art thermal printhead described above, since the glaze layer 103 alone cannot provide a sufficient heat retaining function, the amount of heat which is dissipated into the atmosphere via the substrate 102 and the heat sink plate 101 will increase, consequently failing to provide a satisfactory printing performance when the supplied power is reduced below a predetermined level.

On the other hand, with a recent development of various office automation machines, there is an increasing demand for portable thermal printers of battery drive type (i.e., low power consumption type). However, the above-described prior art thermal printhead is not suitable for constituting a portable thermal printer of battery drive type (i.e., low power consumption type).

In order to overcome such a problem, Japanese Patent Publication No. 3(1991)-21352 for example proposes formation of a hollow portion 110 (shown by the phantom lines in FIG. 9) in the glaze layer 103 to additionally increase heat retention near the heating resistor 104. The hollow portion 110 may be formed, for example, by the steps of forming a strip-like dissolvable layer (of e.g. silver) on the substrate 102, forming a glaze layer 103 to cover the dissolvable layer, and then dissolving the dissolvable layer with a chemical solution.

However, the above-described solution has a cost increase problem because the steps of forming the hollow portion 110 (formation and removal of the dissolvable layer) are troublesome.

Further, since the formation of the hollow portion 110 needs the presence of the glaze layer 103 as a prerequisite, it is impossible to form such a hollow portion 110 if the substrate 102 itself is formed of a material having a low thermal conductivity for power consumption decrease to obviate the need for a glaze layer. Moreover, since the size and like of the hollow portion 110 are restricted by the thickness and like of the glaze layer 103 for example, the range of realizable printing performance is also greatly limited.

DISCLOSURE OF THE INVENTION

An object of the present invention is to provide a thermal printhead which can overcome the problems described above.

Another object of the present invention is to provide a substrate suitable for such a thermal printhead.

Sill another object of the present invention is to provide an advantageous method for making such a substrate.

According to a first aspect of the present invention, there is provided a thermal printhead comprising: a substrate of an insulating material having a substantially flat surface; heating resistor means formed on the substrate to form a plurality of heating dots; a conductor pattern formed on the substrate for electrical connection to the heating resistor means; and driving means mounted on the substrate for selectively heating the heating dots via the conductor pattern; wherein the substrate has, in its wall thickness, a hollow portion extending along the heating resistor means.

With the arrangement described above, since the hollow portion can provide an enhanced heat retaining ability adjacent the heating resistor means to prevent heat dissipation to the substrate, power consumption can be greatly reduced in comparison with the conventional thermal printhead which has no hollow portion. Therefore, the thermal printhead with the arrangement described above is suitable for constituting a battery-driven portable thermal printer. In addition, since the hollow portion is formed in the wall thickness of the substrate, there are less limitations on the size and configuration of the hollow portion in comparison with the conventional arrangement wherein the hollow portion is formed in the glaze layer, thereby making it possible to correspondingly widen the range of realizable printing performance while also reducing the size due to the omission of the glaze layer.

The hollow portion may preferably have a rectangular cross section. Further, the substrate may be advantageously formed of homogeneous crystallized glass which comprises a mixture of alumina and a glass material.

According to a preferred embodiment of the present invention, the heating resistor means and the conductor pattern are covered with a protective means, wherein a portion of the protective means located at the heating resistor means has a higher thermal conductivity than the substrate. In this case, the protective means preferably comprises first protective layers covering the conductor pattern on both sides of the heating resistor means and having a lower thermal conductivity, and a second protective layer covering the heating resistor means and having a higher thermal conductivity. With such an arrangement, it is possible to increase heat conduction to a printing medium (thermosensitive paper for example) at the position of the heating resistor means, while heat dissipation can be reduced at other positions. Thus, it is possible to further reduce the power needed for printing. The second protective layer may be formed of a material containing a filler for improving thermal conductivity for example.

According to a second aspect of the present invention, there is provided a substrate of an insulating material for a thermal printhead comprising a substantially flat surface, wherein the substrate has, in its wall thickness, a hollow portion extending in a strip form.

According to a third aspect of the present invention, there is provided a method for making a substrate for a thermal printhead comprising the steps of: forming at least one perforated green sheet which has at least one slit and a plurality of non-perforated green sheets, the perforated sheet and non-perforated sheets being substantially flat; laminating the perforated green sheet and all of the non-perforated green sheets in a manner such that the perforated green sheet is sandwiched between the non-perforated green sheets; and baking the obtained laminate at a predetermined baking temperature; whereby the substrate is made to have, in its wall thickness, a hollow portion extending in a strip form.

According to the method described above, the hollow portion can be formed in the wall thickness of the substrate simply by laminating the two kinds of green sheets and baking the resulting laminate. Thus, it is possible to avoid the conventionally required, troublesome steps of forming and removing a dissolvable layer. Therefore, it is possible to greatly reduce the cost for manufacturing the substrate, namely thermal printhead.

According to a preferred embodiment of the method of the present invention, prior to the step of laminating the perforated green sheet and all of the non-perforated green sheets, the perforated green sheet and at least one of the non-perforated green sheets are laminated and bonded to each other under compression to form a first divisional laminate body, whereas the remaining non-perforated green sheets are laminated and bonded to each other under compression to form a second divisional laminate body, the first divisional laminate body and the second divisional laminate body being subsequently laminated and bonded to each other under compression to form a combined laminate, the resulting combined laminate body being baked at said predetermined baking temperature.

According to another preferred embodiment of the method of the present invention, prior to the step of laminating the perforated green sheet and all of the non-perforated green sheets, the perforated green sheet and at least one of the non-perforated green sheets are compressed separately, whereas the remaining non-perforated green sheets are laminated and bonded to each other under compression to form a divisional laminate body, the perforated green sheet and said at least one non-perforated, compressed green sheet being subsequently laminated on the divisional laminate body for bonding to each other under compression to form a combined laminate body, the combined laminate body being baked at said predetermined temperature.

According to still another preferred embodiment of the method of the present invention, a thermally decomposable resin member is fitted in the slit of the perforated green sheet when the perforated green sheet and all of the non-perforated green sheets are laminated, the resin member evaporating and dissipating by thermal decomposition at the time of baking the laminate.

In any one of the embodiments of the method described above, each of the perforated and non-perforated green sheets preferably contains alumina, a glass material and a thermoplastic resin which evaporates by thermal decomposition at the baking temperature. In this case, the thermoplastic resin serves to bond the green sheets to each other, but will evaporate for dissipation by thermal decomposition at the time of baking.

Other features and advantages of the present invention will be clearer from the detailed explanation of the embodiments described below with reference to the accompanying drawings.

BEST MODE FOR CARRYING OUT THE INVENTION

The preferred embodiments of the present invention will be described below with reference to the accompanying drawings.

In FIGS. 1–4, a thermal printhead according to an embodiment of the present invention is generally indicated by reference number 1. The thermal printhead 1 includes a strip-like substrate 2 (see FIG. 4) which is made of an insulating material such as a mixture of alumina and borosilicate glass (referred to as "ceramic glass" or "crystallized glass").

The upper surface of the substrate 2 has a linear heating resistor 3 formed along one longitudinal edge of the substrate 2 by printing a paste of resistor material such as ruthenium oxide for example. In addition, the upper surface of the substrate 2 is provided with a plurality of drive ICs (only one shown in FIG. 1) which actuate the heating resistor 3 for divisional driving in the longitudinal direction as well as with a conductor pattern. While the heating resistor 3 is formed as a thick film in the illustrated embodiment, it may be formed as a thin film.

Figure 1:
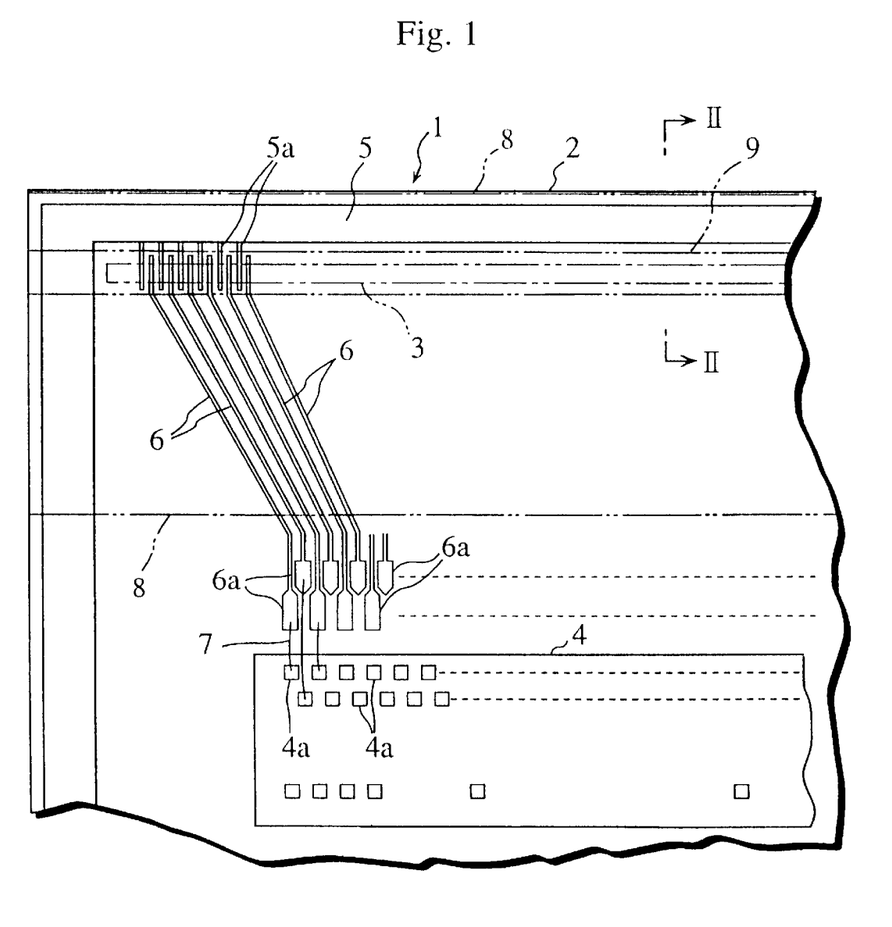
FIG. 1 is a fragmentary plan view showing a principal part of a thermal printhead according to a preferred embodiment of the present invention.

The conductor pattern on the upper surface of the substrate 2 includes a common electrode 5 extending between the abovementioned one longitudinal edge of the substrate 2 and the heating resistor 3, and a multiplicity of individual electrodes 6 extending from the heating resistor 3 toward the respective drive ICs 4. The common electrode 5 has a multiplicity of comb-like teeth 5a which intersect the heating resistor 3 and are constantly spaced longitudinally of the heating resistor 3. One end of each individual electrode 6 intersects the heating resistor 3 between the comb-like teeth 5a of the common electrode 5. On the other hand, the other end of each individual electrode 6 is formed with a connecting pad 6a for electrical connection to an output pad 4a of the corresponding drive IC 4 by bondwire 7. Therefore, when driving signals are selectively fed to the individual electrodes 6, an electric current passes selectively through relevant portions (heating dots) of the heating resistor 3 which are sectioned by the comb-like teeth 5a of the common electrode 5, thereby performing a desired printing operation.

Figure 2:
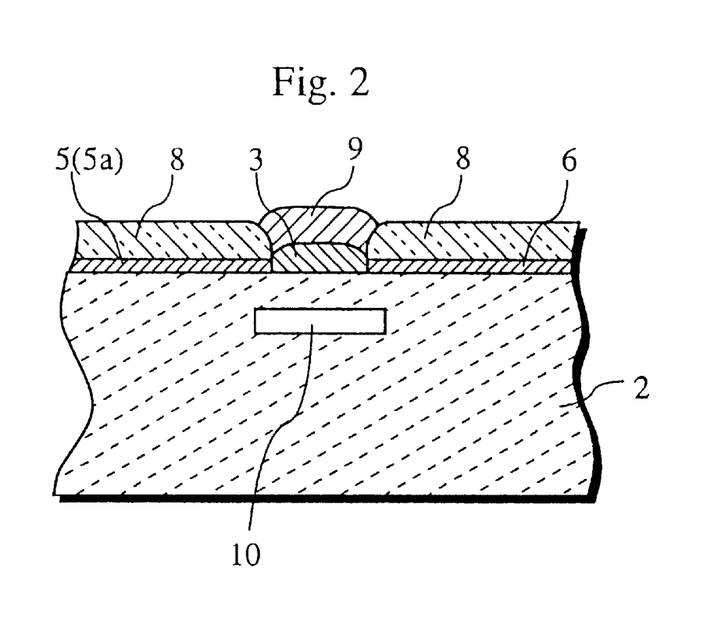
FIG. 2 is a sectional view taken on lines II—II in FIG. 1.

In the illustrated embodiment, first protective layers 8 having a low thermal conductivity are formed on the substrate 2 to cover the common electrode 5 and the individual electrodes 6, respectively, on both sides of the heating resistor 3. Further, a second protective layer 9 having a high thermal conductivity is formed to cover the upper surface of the heating resistor 3.

The first protective layers 8 are preferably made of a glass material containing silicate glass as a main constituent. Such a glass material is commercially available as overcoat glass and has a low thermal conductivity of about 1.3 w/m·K. However, the first protective layers 8 may be made of other insulating protective material having a lower thermal conductivity (no more than 5 w/m·K for example) than the second protective layer 9.

On the other hand, the second protective layer 9 is made of a protective material whose thermal conductivity is larger (e.g. 20–100 w/m·K, preferably 30–50 w/m·K) than the first protective layers 8. Examples of protective material having such a high thermal conductivity include a heat-resistant material containing alumina ($Al_2O_3$) as a main component, a glass material prepared by mixing a conventional silicate glass (overcoat glass) with a thermal conductivity enhancing filler, and a ceramic material prepared by mixing silicon dioxide ($SiO_2$) with a thermal conductivity enhancing filler. Examples of thermal conductivity enhancing filler include alumina (100% alumina) having a thermal conductivity of about 36 w/m·K, aluminum nitride (AlN) having a thermal conductivity of about 60–250 w/m·K, and silicon carbide (SiC) having a thermal conductivity of about 260 w/m·K. In this case, the amount of added filler is suitably determined depending for example on the kind of selected filler and the required printing performance.

Further, in the illustrated embodiment, a hollow portion 10 is formed in the wall thickness of the substrate 2 immediately under the heating resistor 3. The hollow portion 10 has a rectangular cross section and extends along the heating resistor 3 in a strip form. However, the cross section of the hollow portion 10 may be non-rectangular; trapezoidal for example.

With the thermal printhead 1 described above, the second protective layer 9 having a high thermal conductivity (e.g. 30–50 w/m·K) enhances heat transmission immediately above the heating resistor 3, whereas the first protective layers 8 having a low thermal conductivity (e.g. 5 w/m·K) remarkably reduces heat dissipation on the both sides of the heating resistor 3. Therefore, the heat generated by the heating resistor 3 can be effectively utilized for heating a printing medium (e.g. thermosensitive paper) held in contact with the second protective layer 9.

Figure 3A:
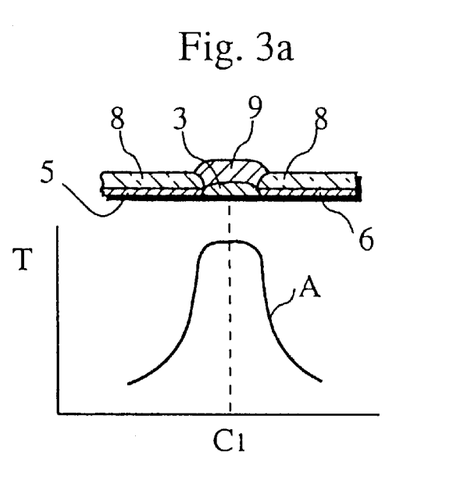
FIG. 3a is a graph showing the temperature distribution of the same thermal printhead in operation.

FIG. 3a is a graph which schematically shows the temperature distribution of the above-described thermal printhead 1 in operation. In FIG. 3a, the abscissa represents the distance from the center $C_1$ of the heating resistor 3, whereas the ordinate represents the temperature. As indicated by curve A in FIG. 3a, the temperature rises sharply at the second protective layer 9 having a high thermal conductivity, whereas there is a sharp temperature drop at the first protective layers 8 having a low thermal conductivity. Thus, it can be appreciated that the thermal printhead 1 according to the present invention exhibits an excellent printing performance by effectively utilizing the heat generated by the heating resistor 3.

Figure 3B:
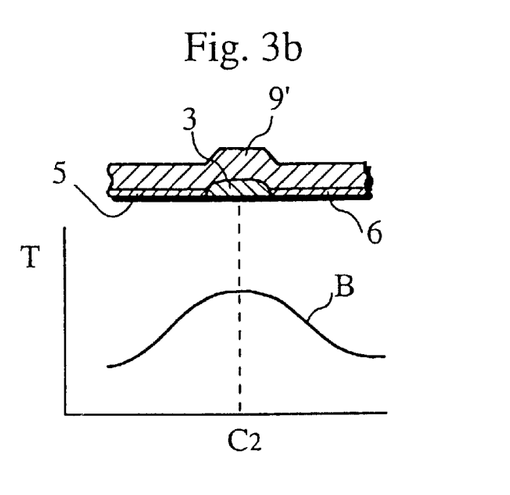
FIG. 3b is a graph showing the temperature distribution of a slightly modified version of the thermal printhead for purposes of comparison.
Figure 4:
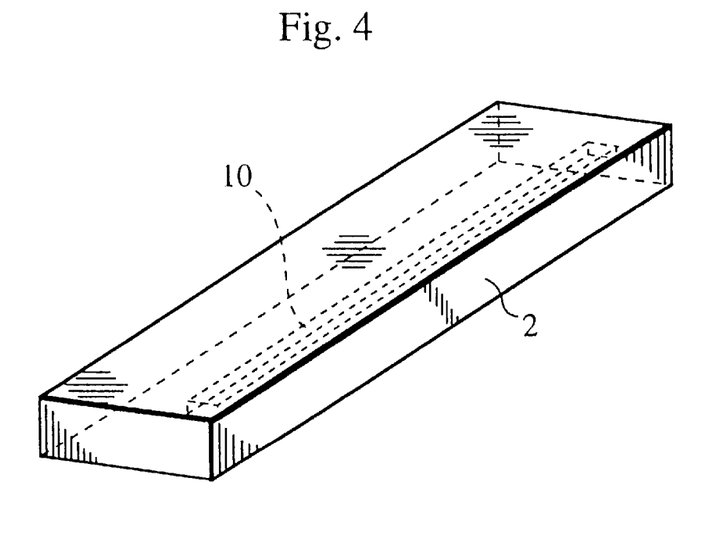
FIG. 4 is a perspective view showing a substrate used for the thermal printhead illustrated in FIGS. 1 and 2.

FIG. 3b is a graph which schematically shows the temperature distribution of a comparative thermal printhead in operation. In the comparative thermal printhead, a single protective layer 9' having a high thermal conductivity covers not only the heating resistor 3 but also the common electrode 5 and individual electrodes 6. The abscissa of FIG. 3b represents the distance from the center $C_2$ of the heating resistor 3, whereas the ordinate represents the temperature. As indicated by curve B in FIG. 3b, the temperature rises gently because heat dissipation is accelerated also above the common electrode 5 and individual electrodes 6, consequently failing to provide a sharp printing quality.

Below the heating resistor 3, on the other hand, the strip-like hollow portion 10 located immediately under the heating resistor 3 remarkably reduces heat transmission to the substrate 2 and heat dissipation from the substrate 2. As a result, the heat (i.e. electric power) needed for performing a desired printing operation can be reduced, so that the substrate 2 with the hollow portion 10 is particularly suitable for constituting a portable battery-driven thermal printhead wherein power consumption is greatly restricted. Further, the above-described thermal printhead 1 is also suitable for forming large size dots with a small power supply.

The above-described thermal printhead 1 may be conveniently manufactured by the following process.

Figure 5:
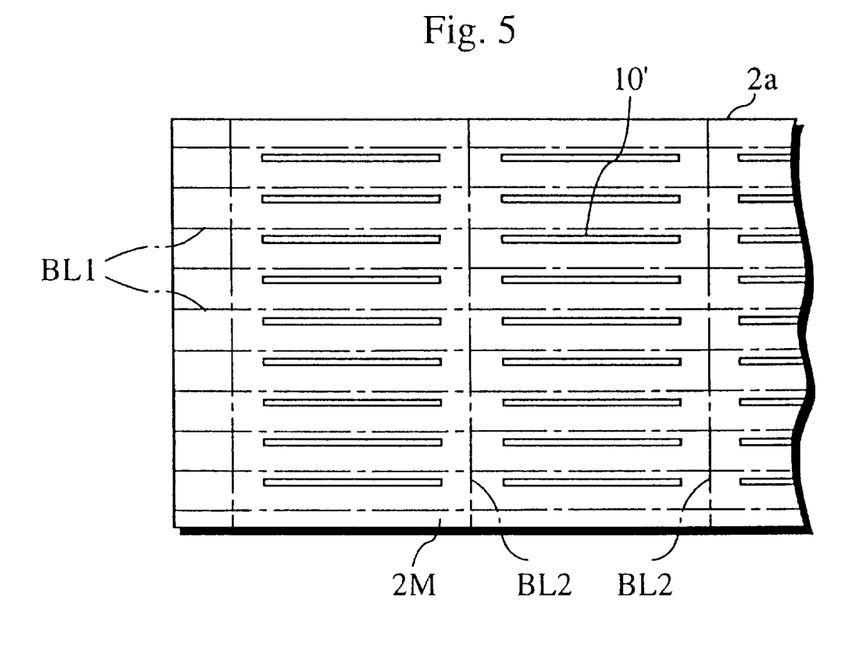
FIG. 5 is a plan view showing a green sheet with slits used for making the substrate of FIG. 4.
Figure 6A:
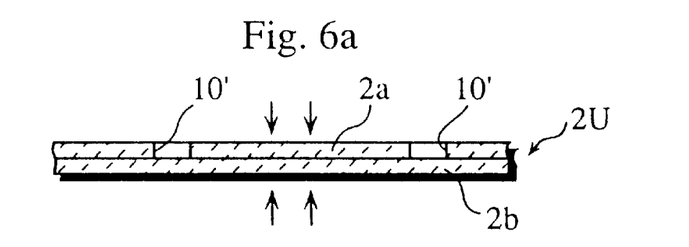
FIGS. 6a–6d are sectional views showing a method for making the substrate of FIG. 4.
Figure 6B:
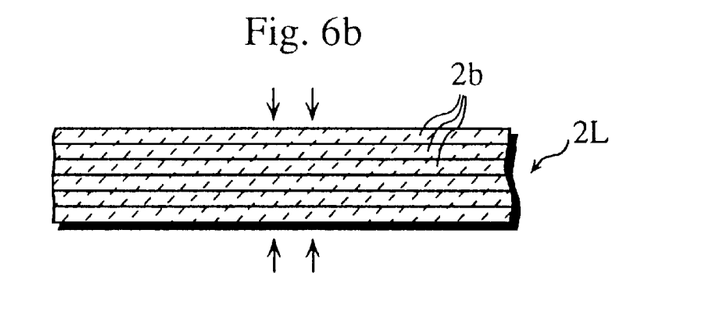

First, as shown in FIGS. 5, 6a and 6b, a perforated green sheet 2a having a plurality of slits 10' in a matrix arrangement and a plurality of non-perforated green sheets 2b are prepared separately. As shown in FIG. 5, the slits 10' of the perforated green sheet 2a are so arranged that, when the green sheet is divided along longitudinal break lines $BL_1$ and widthwise break lines $BL_2$, a single slit 10' is contained in each divided section. The slits 10' may be formed by punching with a press for example.

Each of the perforated green sheet 2a and non-perforated green sheet 2b is flat with a size of about 320 mm long, about 130 mm wide and about 0.2 mm thick for example. The composition of each green sheet 2a, 2b, in proportion by weight, is about 35% of powdered alumina, about 35% of borosilicate glass and about 30% of thermoplastic resin (preferably polyvinylbutyral resin). The thermoplastic resin used for the green sheets is not limited to polyvinylbutyral resin. Any resin is applicable as long as the resin, like polyacryl resin, softens to become adherent when heated to a temperature of about 80–100° C., and evaporates by thermal decomposition when heated at a higher temperature of about 500° C.

Then, as shown in FIG. 6a, the perforated green sheet 2a is laminated on one non-perforated green sheet 2b and kept at a temperature of about 90° C. under compression of about 200 kg/cm$^2$ for about 30 minutes. The thermoplastic resin contained in both kinds of green sheets 2a, 2b softens by the heat (about 90° C.) during the compression. As a result, the green sheets 2a, 2b will bond to each other by the softened thermoplastic resin to form an upper laminate body 2U wherein the slits 10' of the perforated green sheet 2a are bottomed by the non-perforated green sheet 2b. The compression force, heating temperature and compression (heating) time of this process step may be suitably varied within the ranges of 150–250 kg/cm$^2$, 80–110° C. and 5–30 minutes, respectively.

Then, as shown in FIG. 6b, a plurality of non-perforated green sheets 2b are laminated and kept at a temperature of about 90° C. under compression of about 200 kg/cm$^2$ for about 30 minutes.

As a result, the non-perforated green sheets 2b bond to each other to form a lower laminate body 2L due to softening of the thermoplastic resin contained therein. The compression force, heating temperature and compression (heating) time of this process step may be also varied suitably within the ranges of 150–250 kg/cm$^2$, 80–110° C. and 5–30 minutes, respectively.

Figure 6C:
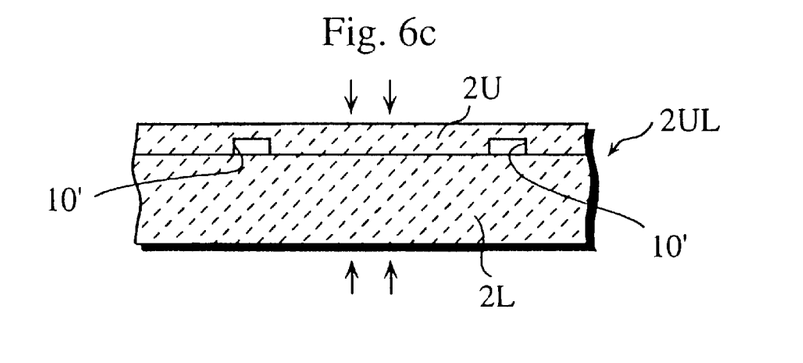

Then, as shown in FIG. 6c, the upper laminate body 2U is overturned laminated on the lower to be laminate body 2L to close the open side of the respective slits 10' and kept at a temperature of about 90° C. under compression of about 200 kg/cm$^2$ for about 30 minutes. As a result, the upper laminate body 2U will bond to the lower laminate body 2L to form a combined laminate body 2UL due to softening of the thermoplastic resin. Again, the compression force, heating temperature and compression (heating) time of this process step may be also varied suitably within the ranges of 150–250 kg/cm$^2$, 80–110° C. and 5–30 minutes, respectively.

Figure 6D:
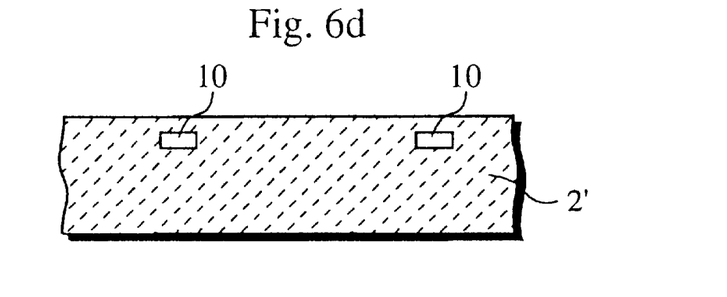

Then, the resulting combined laminate body 2UL is put into a baking furnace (not shown) for gradual heating from a room temperature, and baked at a temperature of about 900° C. for about 2 hours before effecting a gradual temperature drop. In this process step, the thermoplastic resin contained in the combined laminate body 2UL evaporates for dissipation by thermal decomposition when the temperature rises beyond 500° C., whereas the alumina and glass constituents are partially crystallized at the baking temperature (about 900° C.). As a result, a baked master substrate 2' is obtained which has a plurality of hollow portions 10 within the wall thickness and is physically and chemically stable, as shown in FIG. 6d. In this baking step, again, the baking temperature, the baking time and the like may be suitably varied.

In the compression and baking steps, the size of the respective green sheets 2a, 2b will reduce by about 30% in the pressing direction, and by about 13% in a direction which is perpendicular to the pressing direction. Therefore, the initial size of the respective green sheets 2a, 2b as well as the number of the necessary green sheets should be determined in advance by considering the size contraction and the desired final size of the master substrate 2'.

In the illustrated embodiment, the respective green sheets 2a, 2b has an equal thickness. However, the perforated green sheet 2a may differ from the non-perforated green sheets 2b in thickness, and the non-perforated green sheets 2b may differ from each other in thickness. By suitably altering the thickness of the green sheets 2a, 2b in this way, the height and thickness of the hollow portion 10 can be varied for adjusting the printing performance as required.

Further, the numbers of non-perforated green sheets 2b to be included in the upper laminate body 2U (FIG. 6a) and in the lower laminate body 2L (FIG. 6b) may also be optional. Therefore, the height of the hollow portion 10 (FIG. 6d) can be also adjusted by selecting the number of non-perforated green sheets 2b to be included in both of the laminate bodies 2U, 2L.

Moreover, the upper laminate body 2U (FIG. 6a) may include no less than two perforated green sheets 2a. Thus, by suitably altering the number of the perforated green sheets 2a included in the upper laminate body 2U, the thickness of the hollow portion 10 (FIG. 6d) can be adjusted.

Still further, it is also possible to alter the length, width and configuration of the slit 10' of the perforated green sheet 2a, thereby providing an additional way for adjusting the printing performance.

After forming the master substrate 2' through the above-described process steps (FIGS. 6a–6d), a conductive paste containing gold is applied to the upper surface of the master substrate 2' by screen printing, and then baked to form a conductor film (not shown).

Then, the conductor film is etched in a predetermined pattern to form a common electrode 5 and individual electrodes 6 (see FIGS. 1 and 2) in corresponding relationship to each hollow portions 10.

Then, a resistor paste containing ruthenium oxide is linearly applied in a thick film on the upper surface of the master substrate 2' along each hollow portions 10, and thereafter baked to form a heating resistor 3 (FIGS. 1 and 2).

Then, a conventional overcoat glass paste (having a low thermal conductivity) is applied, by screen printing, to the upper surface of the master substrate 2' on both sides of the heating resistor 3, and thereafter baked to form first protective layers 8 (FIGS. 1 and 2) having a thickness of about 4 $\mu$m for example.

Then, a glass paste containing a highly thermally conductive substance as a filler is applied, by screen printing, to cover the exposed heating resistor 3, and thereafter baked to form a second protective layer 9 (FIGS. 1 and 2) having a thickness of about 6 $\mu$m for example.

Then, the thus treated master substrate 2' is divided along the longitudinal break lines BL1 and the widthwise break lines BL2 (see FIG. 5). As a result, a plurality of individual substrates 2 (see FIG. 4) is obtained each of which has a homogeneous composition and is internally formed with a strip-like hollow portion 10.

Finally, drive ICs 4 (FIG. 1) are mounted on each individual substrate 2, and necessary treatments such as wire bonding are performed to provide a desired thermal printhead.

According to the method described above, the hollow portion 10 can be easily formed simply by the steps of suitably laminating the two kinds of green sheets 2a, 2b, and then compressing and heating the laminate. Further, as already described, the size and level of the hollow portion 10 can easily be adjusted only by suitably altering the thicknesses of the green sheets 2a, 2b as well as the manner of laminating them.

In the illustrated embodiment, the perforated green sheet 2a comprises a plurality of mutually independent slits 10' disposed in a matrix arrangement (see FIG. 5). However, the slits 10' of the perforated green sheet 2a may extend continuously in the longitudinal direction across the widthwise break lines BL2.

Further, in the illustrated embodiment, the heating resistor 3, the common electrode 5 and the individual electrodes 6 are formed directly on the master substrate 2' (i.e. the individual substrate 2). However, the upper surface of the master substrate 2 may be entirely or partially formed with a glaze layer (not shown) on which the heating resistor 3, the common electrode 5 and the individual electrodes 6 may be formed.

FIGS. 7a–7e show a second embodiment of method for manufacturing the substrate 1 according to the present invention.

Figure 7A:
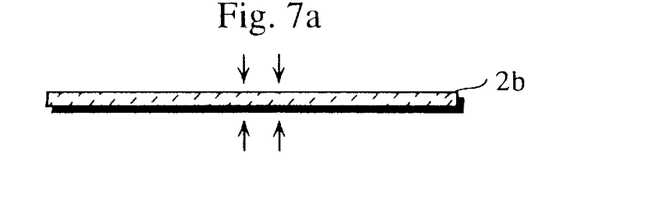
FIGS. 7a–7e are sectional views showing another method for making the substrate of FIG. 4.
Figure 7B:
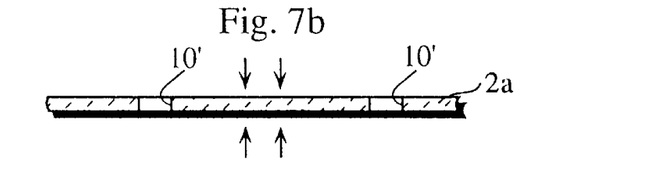

In the second embodiment, a non-perforated green sheet 2b and a perforated green sheet 2a are first heated separately under compression and kept in this state for a predetermined time, as shown in FIGS. 7a and 7b. The compression force, heating temperature and compression (heating) time of this process step may be suitably varied within the ranges of 150–250 kg/cm², 80–110° C. and 5–30 minutes, respectively. The reason for separately compressing the non-perforated green sheet 2b and the perforated green sheet 2a is as follows. In the foregoing embodiment, when both green sheets 2a, 2b are laminated and compressed together as shown in FIG. 6a, the non-perforated green sheet 2b tends to partially project into the slits 10' of the perforated green sheet 2a due to the internal material movement caused by the compression, so that the configuration and dimension of the subsequently formed hollow portion 10 may deviate from what are previously expected. By contrast, when both green sheets 2a, 2b are separately compressed, such inconvenience will not occur.

Figure 7C:
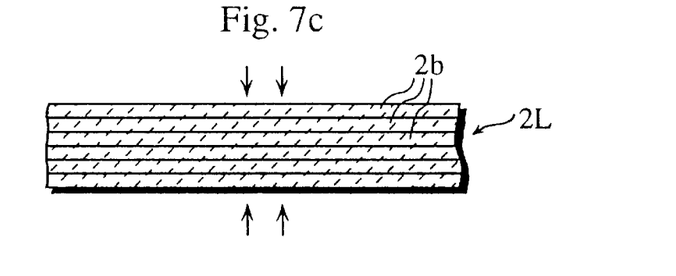

Then, as shown in FIG. 7c, a plurality of non-perforated green sheets 2b are laminated and kept under compression and heating for a predetermined time to form a lower laminate body 2L. The compression force, heating temperature and compression (heating) time of this process step may be also varied suitably within the ranges of 150–250 kg/cm², 80–110° C. and 5–30 minutes, respectively.

Figure 7D:
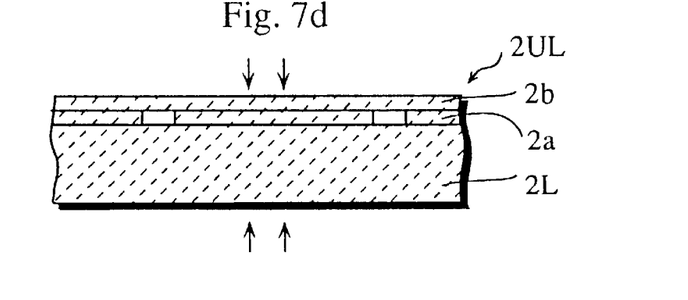

Then, as shown in FIG. 7d, the previously compressed, perforated green sheet 2a and the previously compressed, non-perforated green sheet 2b are laminated on the lower laminate body 2L in the mentioned order, and together kept under compression and heating for a predetermined time to form a combined laminate body 2UL. Again, the compression force, heating temperature and compression (heating) time of this process step may be also varied suitably within the ranges of 150–250 kg/cm², 80–110° C. and 5–30 minutes, respectively. The compression force applied in this process is mainly utilized for bonding between the perforated green sheet 2a and the lower laminate body 2L as well as between the perforated green sheet 2a and the non-perforated green sheet 2b.

Figure 7E:
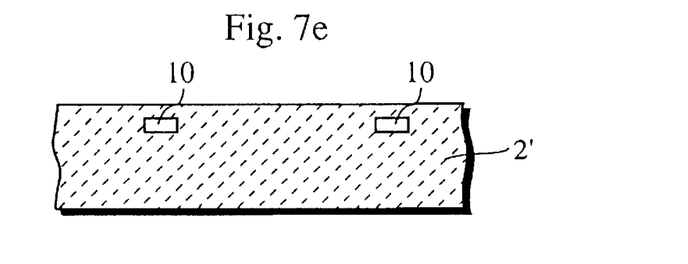

Then, the resulting combined laminate body 2UL is put into a baking furnace (not shown) for gradual heating from a room temperature, and baked at a temperature of about 900° C. for about 2 hours before effecting a gradual temperature drop. In this process step, the thermoplastic resin contained in the combined laminate body 2UL evaporates for dissipation by thermal decomposition when the temperature rises beyond 500° C., whereas the alumina and glass constituents are partially crystallized at the baking temperature (about 900° C.). As a result, a baked master substrate 2' is obtained which has a plurality of hollow portions 10 within the wall thickness and is physically and chemically stable, as shown in FIG. 7e.

The subsequent process steps are the same as those of the foregoing embodiment.

Figure 8A:
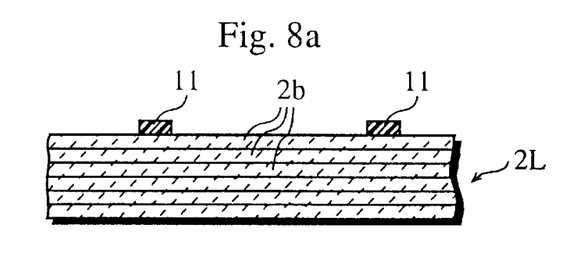
FIGS. 8a–8c are sectional views showing sill another method for making the substrate of FIG. 4.
Figure 8B:
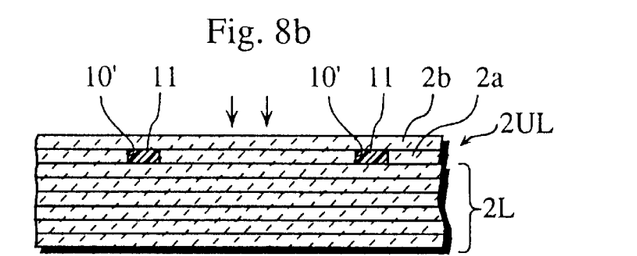
Figure 8C:
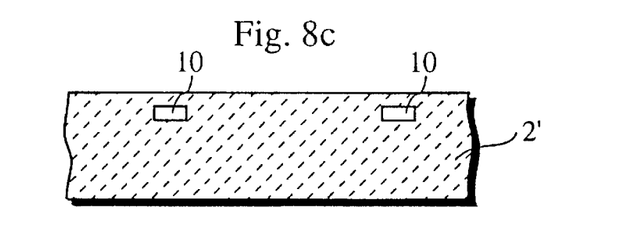

FIGS. 8a–8c show a third embodiment of method for manufacturing the substrate 2 according to the present invention.

In the third embodiment, strip-like resin members 11 are first formed, by screen printing, on a lower laminate body 2L in corresponding relationship to the respective slits 10' of a perforated green sheet 2a. The strip-like resin members 11 may be made of a material, such as a resin containing polyvinyl alcohol as a main constituent, which will evaporate by thermal decomposition at a temperature of not lower than 500° C. The lower laminate body 2L for use in this process step may be previously heated under compression, or prepared simply by laminating a plurality of non-perforated green sheets 2b.

Then, as shown in FIG. 8b, a perforated green sheet 2a is laminated on the lower laminate body 2L in a manner such that the strip-like resin members 11 fit into the slits 10' of the green sheet 2a, and thereafter a non-perforated green sheet 2b is additionally laminated on the perforated green sheet 2a, whereupon the whole body is kept at a temperature of 80–110° C. under compression of 150–250 kg/cm² for 5–30 minutes. As a result, the green sheets 2a, 2b bond to each other to form a combined laminate body 2UL. In this process step, the perforated green sheet 2a and the non-perforated green sheet 2b provided thereon may be replaced by the upper laminate body 2U of FIG. 6a which has been previously compressed.

Then, the resulting combined laminate body 2UL is put into a baking furnace (not shown) for gradual heating from a room temperature, and baked at a temperature of about 900° C. for about 2 hours before effecting a gradual temperature drop. In this process step, the thermoplastic resin contained in the combined laminate body 2UL evaporates for dissipation by thermal decomposition when the temperature rises beyond 500° C., whereas the alumina and glass constituents are partially crystallized at the baking temperature (about 900° C.). As a result, a baked master substrate 2' is obtained which has a plurality of hollow portions 10 within the wall thickness and is physically and chemically stable, as shown in FIG. 8c. Further, the deformation of the hollow portions 10 is prevented by the previous presence of the strip-like resin member 11.

The subsequent process steps are the same as those of the two foregoing embodiments.

The preferred embodiments of the present invention being thus described, the present invention is not limited to these embodiments. For instance, in forming a substrate 2, a perforated green sheet 2a and a plurality of non-perforated green sheets 2b are laminated together at one time for compression, and thereafter baked. In this case, the conditions for compression and baking may be similar to those which are previously described. Further, in the third embodiment shown in FIGS. 8a–8c, the strip-like resin members 11 may be formed by filling the slits 10' of the perforated green sheet 2a with a thermally decomposable resin. Therefore, the present invention can be modified in various ways within the scope of the attached claims.

We claim:

1. A thermal printhead comprising:

an integral substrate made only of a homogeneous insulating material, the substrate having a first flat surface and a second flat surface;

heating resistor means formed on the first flat surface of the substrate to form a plurality of heating dots;

a conductor pattern formed on the first flat surface of the substrate for electrical connection to the heating resistor; and driving means mounted on the first flat surface of the substrate for selectively heating the heating dots via the conductor pattern;

wherein the substrate has, in its wall thickness, a hollow portion extending along the heating resistor means; and wherein the hollow portion is positioned between the first and second flat surfaces of the substrate, the hollow portion being closed upwardly and downwardly only by said insulating material of the substrate so that the hollow portion is formed entirely within the substrate.

2. The thermal printhead according to claim 1, wherein the hollow portion has a rectangular cross section.

3. The thermal printhead according to claim 1, wherein the substrate is made of homogeneous crystallized glass.

4. The thermal printhead according to claim 3, wherein the substrate is made of a homogeneous mixture of alumina and a glass material.

5. The thermal printhead according to claim 1, wherein the heating resistor means and the conductor pattern are covered by protective means, a portion of the protective means located on the heating resistor means having a higher thermal conductivity than the substrate.

6. The thermal printhead according to claim 5, wherein the protective means comprises first protective layers covering the conductor pattern on both sides of of the heating resistor means and having a lower thermal conductivity, and a second protective layer covering the heating resistor means and having a higher thermal conductivity.

7. The thermal printhead according to claim 6, wherein the second protective layer is made of a material which contains a filler for increasing thermal conductivity.

8. A substrate for a thermal printhead, the substrate being made of only a homogeneous insulating material and having a first flat surface and a second flat surface, wherein the substrate has, in its wall thickness, a hollow portion extending in a strip from, and wherein the hollow portion is positioned between the first and second flat surfaces of the substrate, the hollow portion being closed upward and downward only by said insulating material of the substrate so that the hollow portion is formed entirely within the substrate.

9. The substrate according to claim 8, wherein the hollow portion has a rectangular cross section.

10. The substrate according to claim 8, wherein the substrate is made of homogeneous crystallized glass.

11. The substrate according to claim 10, wherein the crystallized glass is made of a homogeneous mixture of alumina and a glass material.

\* \* \* \* \*